US012782605B2

(12) United States Patent
Zalkovskij et al.

(10) Patent No.: US 12,782,605 B2
(45) Date of Patent: Nov. 3, 2026

(54) METASTRUCTURE OPTICAL ELEMENTS, METASTRUCTURE OPTICAL ASSEMBLIES, AND METHODS OF MANUFACTURING THE SAME

(71) Applicant: NIL Technology ApS, Kongens Lyngby (DK)

(72) Inventors: Maksim Zalkovskij, Copenhagen (DK); Lars Hagedorn Frandsen, Tårnby (DK)

(73) Assignee: NIL Technology ApS (DK)

( * ) Notice: Subject to any disclaimer, the term of this patent is extended or adjusted under 35 U.S.C. 154(b) by 175 days.

(21) Appl. No.: 18/857,737

(22) PCT Filed: Apr. 6, 2023

(86) PCT No.: PCT/EP2023/059166
§ 371 (c)(1),
(2) Date: Oct. 17, 2024

(87) PCT Pub. No.: WO2023/202895
PCT Pub. Date: Oct. 26, 2023

(65) Prior Publication Data

US 2025/0271595 A1 Aug. 28, 2025

Related U.S. Application Data

(60) Provisional application No. 63/332,858, filed on Apr. 20, 2022.

(51) Int. Cl.
*G02B 1/00* (2006.01)
*H10H 29/01* (2025.01)
*H10H 29/855* (2025.01)

(52) U.S. Cl.
CPC ......... *G02B 1/002* (2013.01); *H10H 29/0363* (2025.01); *H10H 29/855* (2025.01)

(58) Field of Classification Search
CPC ...................................................... G02B 1/002
See application file for complete search history.

(56) References Cited

U.S. PATENT DOCUMENTS 10,488,651 B2 11/2019 Kamali et al.
10,795,168 B2 10/2020 Riley et al.
(Continued)

FOREIGN PATENT DOCUMENTS

CA 3074566 A1 3/2019
CN 111656707 A 9/2020
(Continued)

OTHER PUBLICATIONS

International Preliminary Report on Patentability in International Appln. No. PCT/EP2023/059166, mailed on Oct. 8, 2024, 8 pages.
(Continued)

*Primary Examiner* — Edmond C Lau
(74) *Attorney, Agent, or Firm* — Fish & Richardson P.C.

(57) ABSTRACT

The present disclosure describes apparatus including a metastructure optical element and methods for manufacturing metastructure optical elements. An example method includes providing a substrate having an optical etch-deceleration layer thereon, and a stratum over the optical etch-deceleration layer. The method further includes forming a mask on the stratum, and etching the stratum and the optical etch-deceleration layer to form a plurality of groupings of meta-atoms. An amount of etching into the optical etch-deceleration layer differs for each of the each groupings of meta-atoms, such that a first one of the groupings of meta-atoms is composed of first portions of the stratum, and a second one of the groupings of meta-atoms is composed of second portions of the etched stratum and underlying portions of the optical etch-deceleration layer. The method further includes removing the mask, and encapsulating the
(Continued)

first and second groupings of meta-atoms in a material that is index-matched to the optical etch-deceleration layer.

14 Claims, 6 Drawing Sheets

(56) References Cited

U.S. PATENT DOCUMENTS

| | | | |
|---|---|---|---|
| 10,968,522 | B2 | 4/2021 | Akselrod et al. |
| 2018/0292644 | A1 | 10/2018 | Kamali et al. |
| 2019/0064532 | A1 | 2/2019 | Riley et al. |
| 2019/0301025 | A1 | 10/2019 | Akselrod et al. |
| 2020/0142113 | A1* | 5/2020 | Frey ........................ G02B 5/288 |
| 2020/0166783 | A1* | 5/2020 | Roy ....................... G02F 1/0102 |
| 2020/0271837 | A1 | 8/2020 | Greiner et al. |
| 2020/0386911 | A1 | 12/2020 | Doshay et al. |
| 2022/0109287 | A1 | 4/2022 | Lenef et al. |
| 2023/0194883 | A1 | 6/2023 | Riley et al. |

FOREIGN PATENT DOCUMENTS

| | | | |
|---|---|---|---|
| CN | 111936902 | A | 11/2020 |
| CN | 114008524 | A | 2/2022 |
| EP | 3676973 | A1 | 7/2020 |
| EP | 3781969 | A1 | 2/2021 |
| EP | 3676973 | A4 | 5/2021 |
| EP | 3980821 | A1 | 4/2022 |
| JP | 2020-537193 | A | 12/2020 |
| JP | 2021-520513 | A | 8/2021 |
| JP | 2022-535270 | A | 8/2022 |
| KR | 20200047612 | A | 5/2020 |
| KR | 20200128178 | A | 11/2020 |
| KR | 20220005628 | A | 1/2022 |
| SG | 11202001717 | | 3/2020 |
| TW | 202113399 | A | 4/2021 |
| TW | I736303 | B | 8/2021 |
| TW | 202146955 | A | 12/2021 |
| WO | WO 2019/046827 | A1 | 3/2019 |
| WO | WO 2019/195163 | A1 | 10/2019 |
| WO | WO 2020/247169 | A1 | 12/2020 |
| WO | WO 2021/155304 | A1 | 8/2021 |
| WO | WO 2022/058385 | A1 | 3/2022 |
| WO | WO 2022/072880 | A1 | 4/2022 |

OTHER PUBLICATIONS

International Search Report and Written Opinion in International Appln. No. PCT/EP2023/059166, mailed on Jul. 14, 2023, 10 pages.

* cited by examiner

300

METASTRUCTURE OPTICAL ELEMENTS, METASTRUCTURE OPTICAL ASSEMBLIES, AND METHODS OF MANUFACTURING THE SAME

CROSS-REFERENCE TO RELATED APPLICATIONS

This application is a National Stage application under 35 U.S.C. § 371 of International Application No. PCT/EP2023/059166, filed on Apr. 6, 2023, which claims the benefit of priority from U.S. Provisional Patent Application No. 63/332,858, filed on Apr. 20, 2022, the contents and disclosures of which are incorporated herein by reference in their entirety.

FIELD OF THE DISCLOSURES

The present disclosure relates to metastructure optical elements.

BACKGROUND

Metastructure optical elements can include multiple meta-atoms. The manufacture of metastructure optical elements sometimes involves etching the meta-atoms into a stratum. The meta-atoms may occur in different groupings within the metastructure optical element. The different groupings of meta-atoms may have different etch characteristics. For example, the density of the meta-atoms in one grouping may be less than in another grouping. Consequently, metastructure optical elements configured with two or more groupings having different etch characteristics may be particularly difficult to manufacture using known etching methods.

SUMMARY

The present disclosure describes metastructure optical elements. For example, in one aspect, the disclosure describes an apparatus including a metastructure optical element that includes a substrate; a first grouping of meta-atoms having a first etch characteristic, the first grouping of meta-atoms being composed of a first etched stratum; and a second grouping of meta-atoms having a second etch characteristic, the second grouping of meta-atoms being composed of a second etched stratum and an etched optical etch-deceleration layer. The second etched stratum is disposed on the etched optical etch-deceleration layer, and the optical etch-deceleration layer is disposed on the substrate. The first and second groupings of meta-atoms are encapsulated in a material that is index-matched to the optical etch-deceleration layer.

The aforementioned metastructure optical element can, in some instances, exhibit more advanced or sophisticated optical functionality due to the incorporation of two or more groupings of meta-atoms with different etch characteristics into the optical design of the metastructure optical element, as well as encapsulation of the meta-atoms in the index-matched encapsulant.

Some implementations include one or more of the following features. For example, in some cases, the first and second groupings of meta-atoms are encapsulated in a spin-on glass or a polymer. In some case, the optical etch-deceleration layer is composed of $Al_2O_3$ and/or the meta-atoms are composed of at least one of polysilicon, amorphous silicon, crystalline silicon, silicon nitride, zinc oxide, titanium oxide, aluminum zinc oxide, or a niobium oxide.

In some implementations, the metastructure optical element includes the first grouping of meta-atoms being disposed with a higher density than the second grouping of meta-atoms. This aspect can permit the incorporation of advanced optical functionality into the optical design of the metastructure optical element.

In some implementations, the metastructure optical element assembly further includes an adhesion layer disposed between the substrate and the etch-deceleration layer. The adhesion layer may prevent delamination of the optical etch-deceleration layer from the substrate.

The present disclosure further describes processes for manufacturing one or more metastructure optical elements. In some implementations a method for manufacturing one or more metastructure optical elements includes providing a substrate having an optical etch-deceleration layer thereon, and a stratum over the optical etch-deceleration layer. The method further includes forming a mask on the stratum, and etching the stratum and the optical etch-deceleration layer to form a plurality of groupings of meta-atoms. An amount of etching into the optical etch-deceleration layer differs for each of the groupings of meta-atoms, such that a first one of the groupings of meta-atoms is composed of first portions of the stratum, and a second one of the groupings of meta-atoms is composed of second portions of the etched stratum and underlying portions of the optical etch-deceleration layer. The method further includes removing the mask, and encapsulating the first and second groupings of meta-atoms in a material that is index-matched to the optical etch-deceleration layer.

The aforementioned process for manufacturing a metastructure optical element can permit more advanced or sophisticate optical functionality due to the incorporation of two or more groupings of meta-atoms with different etch characteristics into the optical design of the metastructure optical element, as well as encapsulation of the meta-atoms in the index-matched encapsulant.

The present disclosure further describes optoelectronic modules that include a metastructure optical element.

Other aspects, features and advantages will be readily apparent form the following detailed description, the accompanying drawings, and the claims.

DETAILED DESCRIPTION

Figure 1A:
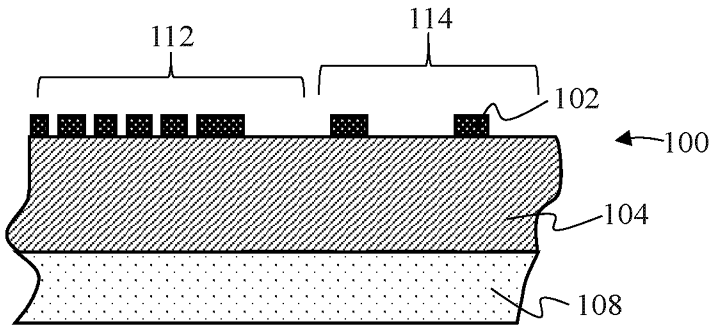
FIG. 1A-FIG. 1D depict example process steps for manufacturing one or more metastructure optical elements.

FIG. 1A-FIG. 1D depict examples of several stages of the manufacturing process of one or more metastructure optical elements. A metastructure optical assembly, as in the metastructure optical assembly 100 depicted in FIG. 1A-FIG. 1D, is an intermediary product created during the manufacture of one or more metastructure optical elements. The metastructure optical assembly 100 includes a mask 102, such as an organic (e.g., amorphous carbon) or inorganic (e.g., SiN, SiON, TiN) hardmask disposed on a stratum 104 (e.g., polysilicon, amorphous silicon, crystalline silicon, silicon nitride, zinc oxide, titanium oxide, aluminum zinc oxide, or a niobium oxide). In some instances, the hardmask may be composed of metal, such as chrome, aluminum or titanium. The mask 102 may be deposited on the stratum 104 by sputtering or chemical vapor deposition, for example. The stratum 104 is disposed on a substrate 108 (e.g., glass, fused silica). The stratum 104 may be deposited onto the substrate 108 by chemical vapor deposition, for example. The metastructure optical assembly 100 can take the form of a wafer having a large lateral dimension with many metastructure optical elements. For example, some wafers may have a radius from 1 inch to more than 20 inches and a thickness of only a few hundred microns, though wafers having other dimensions are within the scope of this disclosure.

Figure 1B:
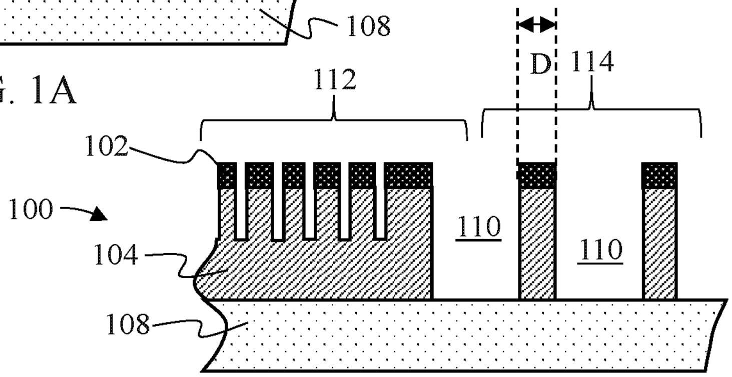
Figure 1C:
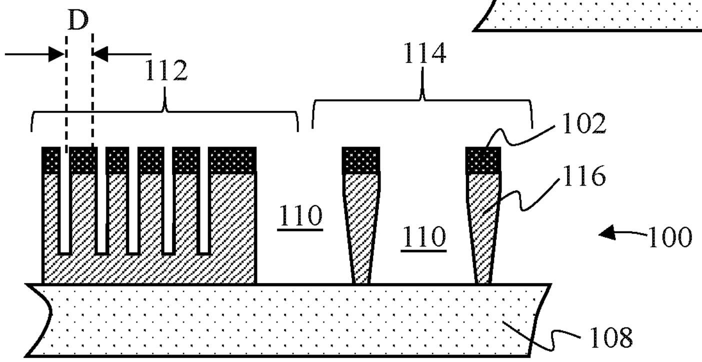
Figure 1D:
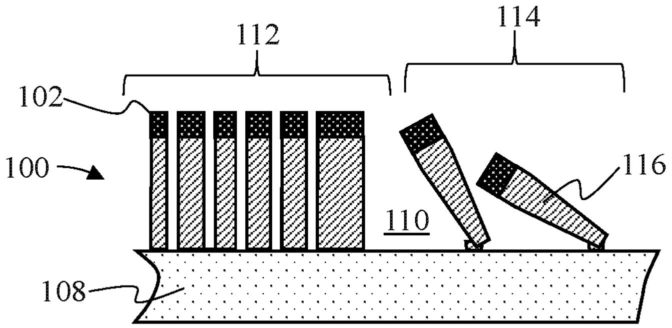

The stratum 104 can be etched, for example, by reactive ion etching as indicated by etched material 110 in FIG. 1B-FIG. 1D. The amount of etched material 110 can be different for different areas of the metastructure optical assembly 100. For example, a first grouping of meta-atoms having a first etch characteristic 112 and a second grouping of meta-atoms having a second etch characteristic 114 are depicted. Different etch characteristics between the groupings may be exhibited due to different densities of individual meta-atoms 116, for example. That is, in some cases, the sum of the areas (e.g., determined via the meta-atom diameters D) of the individual meta-atoms 116 within a particular grouping 112 divided by the area of the metastructure optical element over which that particular grouping occupies may be different than the same for another grouping 114 of meta-atoms 116.

Metastructure optical elements can include multiple meta-atoms 116. The meta-atoms 116 operate together such that the metastructure optical element exhibits some optical effect. A metastructure optical assembly 100 can include just a few metastructure optical elements, or tens, hundreds, or even thousands of metastructure optical elements in some cases. Each metastructure optical element can include just a few meta-atoms, to tens, hundreds, thousands, millions, or even hundreds of millions of meta-atoms. Each of the metastructure optical elements may include two or more groupings of meta-atoms having different etch characteristics. In some instances, however, as depicted in FIG. 1D, some of the meta-atoms 116 within at least one of the groupings may fail, fracture, or otherwise be destroyed during the etching process since the etch rate is different between the two groupings 112 and 114.

FIG. 2A-FIG. 2D depict example process steps for manufacturing one or more metastructure optical elements. A metastructure optical assembly 200 includes a mask 202, such as an organic (e.g., amorphous carbon) or inorganic (e.g., SiN, SiON, TiN) hardmask disposed on a stratum 204 (e.g., polysilicon). In some instances, the hardmask may be composed of metal, such as chrome, aluminum or titanium. The mask 202 may be deposited on the stratum 204 by sputtering or chemical vapor deposition, for example. The stratum 204 is disposed on an optical etch-deceleration layer 206. The maximum allowable thickness of the optical etch-deceleration layer 206 is dependent on its optical properties such as its refractive index and the operating wavelength of the metastructure optical element. In general, the maximum allowable thickness of the optical etch-deceleration layer 206 should be some fraction of the shortest operating wavelength. In some instances, the minimum thickness of the optical etch-deceleration layer 206 is a few nanometers, though in other instances, the minimum thickness may be a few hundred nanometers or more.

The stratum 204 may be deposited on the optical etch-deceleration layer 206 by chemical vapor deposition, for example. In some implementations, the stratum 204 may be deposited on the optical etch-deceleration layer 206 by sputtering or e-beam evaporation. The optical etch-deceleration layer 206 is disposed on a substrate 208 (e.g., glass, fused silica). The optical etch-deceleration layer 206 may be deposited onto the substrate 208 by chemical vapor deposition, for example. The metastructure optical assembly 200 can take the form of a wafer having a large lateral dimension with many metastructure optical elements. For example, some wafers may have a radius from 1 inch to more than 20 inches and a thickness of only a few hundred microns, though wafers having other dimensions are within the scope of this disclosure.

Figure 2A:
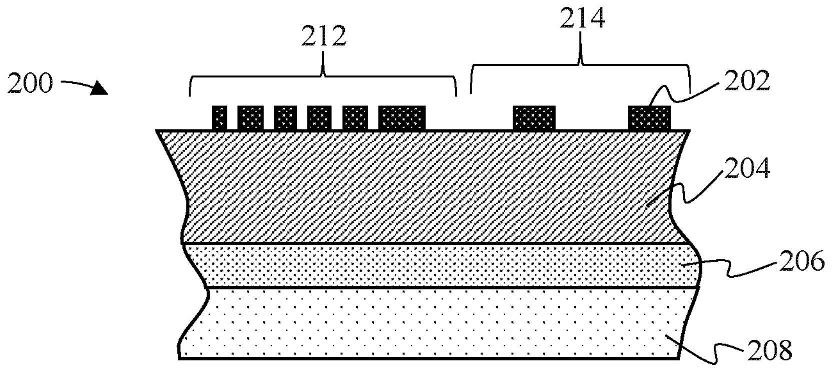
FIG. 2A-FIG. 2D depict example process steps for manufacturing one or more metastructure optical elements.
Figure 2B:
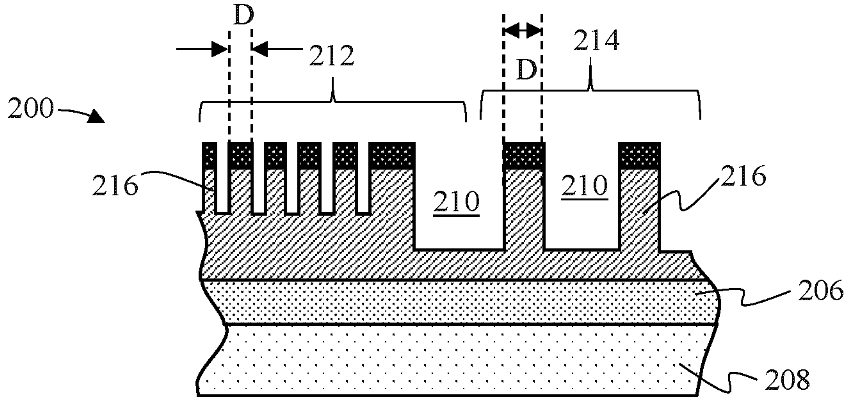
Figure 2C:
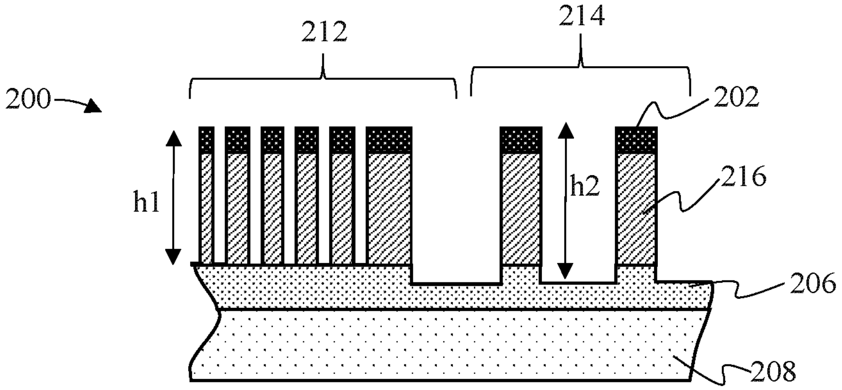

The stratum 204 can be etched, for example, by reactive ion etching as indicated by etched material 210 in FIG. 2B-FIG. 2C. The amount of etched material 210 can be different for different areas of the metastructure optical assembly 200. For example, a first grouping of meta-atoms having a first etch characteristic 212 and a second grouping of meta-atoms having a second etch characteristic 214 are depicted. Different etch characteristics between the groupings may be exhibited due to different densities of individual meta-atoms 216, for example. That is, in some cases, the sum of the areas (e.g., determined via the meta-atom diameters D) of the individual meta-atoms 216 within a particular grouping 212 divided by the area of the metastructure optical element over which that particular grouping occupies may be different than the same for another grouping 214 of meta-atoms 216.

Metastructure optical elements include a multiplicity of meta-atoms 216. The meta-atoms 216 operate together such that the metastructure optical element exhibits some optical effect. A metastructure optical assembly 200 can include just a few metastructure optical elements, tens, hundreds, even thousands of metastructure optical elements in some cases. Each metastructure optical element can include just a few meta-atoms 216, to tens, hundreds, thousands, millions, or even hundreds of millions of meta-atoms 216. Each of the metastructure optical elements may include two or more groupings (such as 212 and 214) of meta-atoms 216 having different etch characteristics.

The optical etch-deceleration layer 206 may be configured to deflect further etching of the stratum 204 from which the individual meta-atoms 216 are composed. For example, the first grouping of meta-atoms 212 with the first etch characteristic exhibits a slower etch characteristic compared to the second grouping of meta-atoms 214 with the second etch characteristic. Consequently, the optical etch-deceleration layer 206 deflects further etching of the stratum 204 that makes up the individual meta-atoms 216 within the grouping 214. In some instances, the etch-deceleration layer 206 is etched instead (as depicted). In some instances, the etch-deceleration layer 206 may inhibit etching of the stratum 204 in the immediate vicinity of the individual meta-atoms 216 within the grouping 214 by absorbing power, for example.

As indicated in the example of FIG. 2C, the height (h2) of meta-atoms 216 in the second grouping 214 is greater than the height (h1) of meta-atoms 216 in the first grouping 212.

Figure 2D:
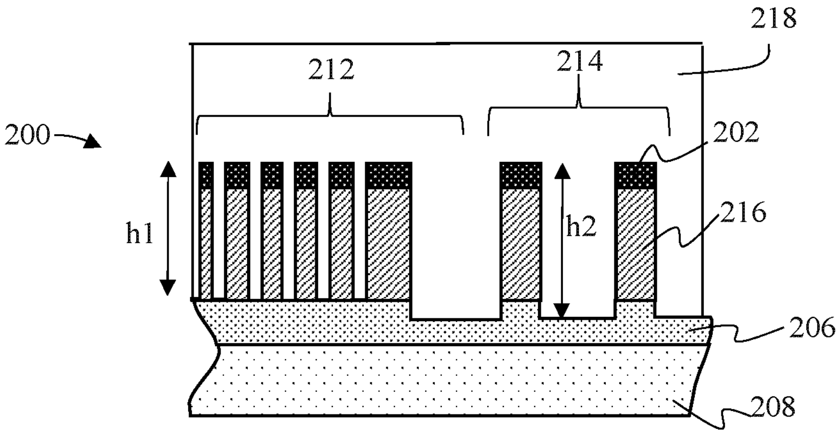

In some applications, the difference in height may lead to non-uniform phase modulation of light incident on a metastructure that includes multiple groupings 212, 214 of meta-atoms. To reduce the extent of any such non-uniform phase modulation, the meta-atoms 216 of both groupings 212, 214 can be encapsulated, as shown in FIG. 2D, in a material 218 that is index-matched to the optical etch-deceleration layer 206. For example, where the optical etch-deceleration layer 206 is composed of $Al_2O_3$, and the meta-atoms are composed of polysilicon, the encapsulation material 218 can be, e.g., a low-index spin-on glass or polymer. By index-matching the encapsulation material to the etch-deceleration layer, the height difference (h2−h1) can be close to zero from an optical point of view so as not to induce phase modulations.

Figure 2E:
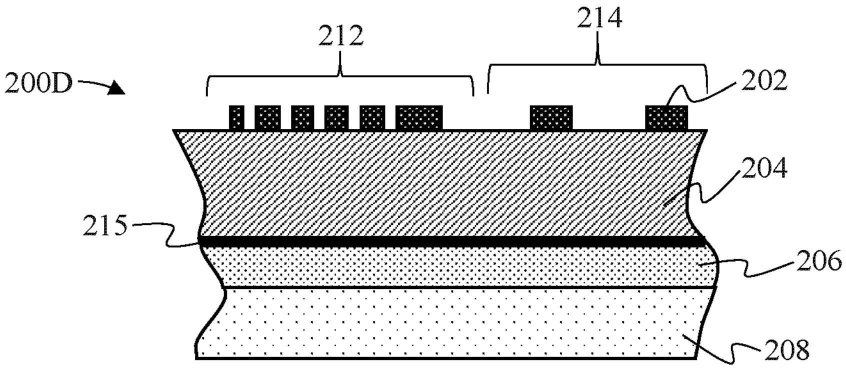
FIG. 2E-FIG. 2F depict further examples of metastructure optical assemblies from which the metastructure optical elements can be manufactured.

FIG. 2E depicts another example of a metastructure optical assembly 200D similar to FIG. 2A. The metastructure optical assembly 200D, however, includes an adhesion layer 215 between the stratum 204 and the optical etch-deceleration layer 206. The adhesion layer 215 is configured to prevent delamination of the stratum 204 from the optical etch-deceleration layer 206. For example, in instances where the optical etch-deceleration layer 206 is composed of $Al_2O_3$ and the stratum 204 is composed of polysilicon, an adhesion layer composed of $SiO_2$ may be disposed therebetween.

Figure 2F:
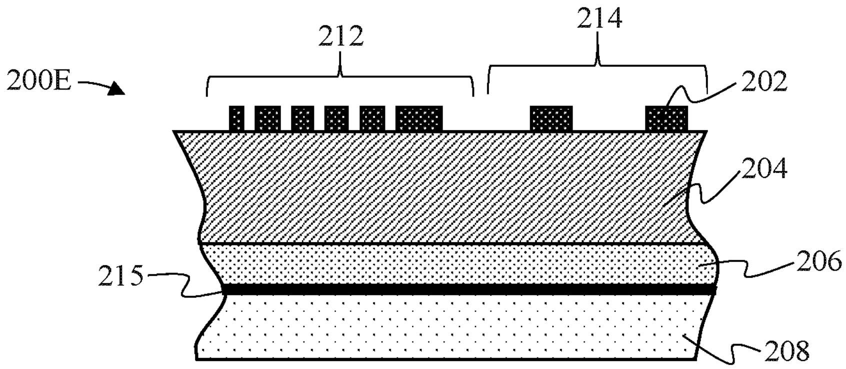

In some implementations, the adhesion layer 215 may be located between other components of the metastructure optical assembly. For example, as depicted in FIG. 2F, an example metastructure optical assembly 200E includes an adhesion layer 215 between the optical etch-deceleration layer 206 and the substrate 208. Still in other embodiments, the adhesion layer 215 may be located both between the substrate 208 and the optical etch-deceleration layer 206 and between the stratum 204 and the optical etch-deceleration layer 206. The maximum allowable thickness of the adhesion layer 215 in any of the described implementations is dependent on its optical properties such as its refractive index and the operating wavelength of the metastructure optical element.

In general, the maximum allowable thickness of the adhesion layer 215 should be some fraction of the shortest operating wavelength (i.e., the wavelength for which the metastructure optical element is designed). The minimum allowable thickness of the adhesion layer 215 is dependent on the mechanical interface between the adhesion layer 215 and the components between which it is disposed. For example, the optical etch-deceleration layer 206 and the adhesion layer 215 and the substrate 208. The adhesion layer 215 should be thick enough to prevent its delamination from either the optical etch-deceleration layer 206 and/or the substrate 208. In some embodiments, the adhesion layer 215 and the optical etch-deceleration layer 206 may be one and the same. That is, the optical etch-deceleration layer 206 may be configured to deflect further etching of the stratum 204 from which the individual meta-atoms 216 are composed, and the optical etch-deceleration layer 206 may be further configured to prevent delamination of the components between which the optical etch-deceleration layer 206 is disposed.

The structures of FIG. 2E and FIG. 2F can be etched to form metastructure optical elements that include two or more groupings of meta-atoms having different etch characteristics as described above in connection with FIGS. 2B and 2C. The resulting meta-atoms of both groupings then can be encapsulated in a material that is index-matched to the optical etch-deceleration layer, as described above in connection with FIG. 2D.

Figure 3:
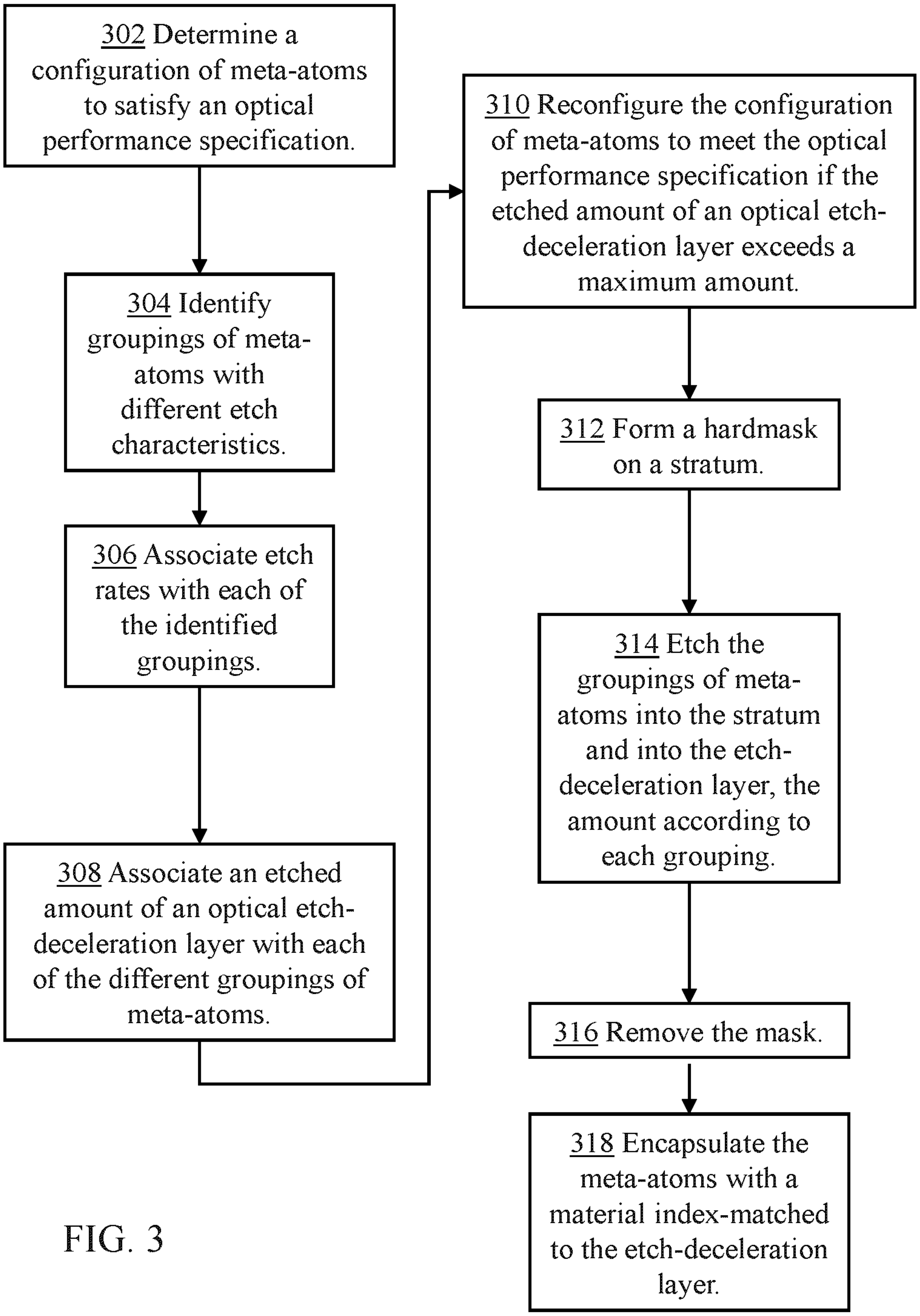
FIG. 3 illustrates an example process for manufacturing one or more metastructure optical elements.

FIG. 3 illustrates an example process 300 for manufacturing one or more metastructure optical elements. As indicated by 302, a configuration of meta-atoms to satisfy an optical performance specification is determined. As indicated by 304, groupings of meta-atoms with different etch characteristics are identified. As indicated by 306, etch rates are associated with each of the identified groupings. As indicated by 308, an etched amount of an optical etch-deceleration layer is associated with each of the different groupings of meta-atoms. As indicated by 310, the configuration of meta-atoms is reconfigured to meet the optical performance specification in the event the etched amount of the optical etch-deceleration layer exceeds some maximum. As indicated by 312, a hardmask is formed on a stratum. As indicated by 314, the groupings of meta-atoms are etched into the stratum and into the etch-deceleration layer, the amount according to each grouping. As indicated by 316, the mask is removed. Then, as indicated by 318, the meta-atoms are encapsulated in an encapsulant material that is index-matched to the underlying etch-deceleration layer. In some cases, resulting structure is separated (e.g., by dicing) into multiple metastructure optical elements each of which has two or more different groups of meta-atoms as described above.

Figure 4A:
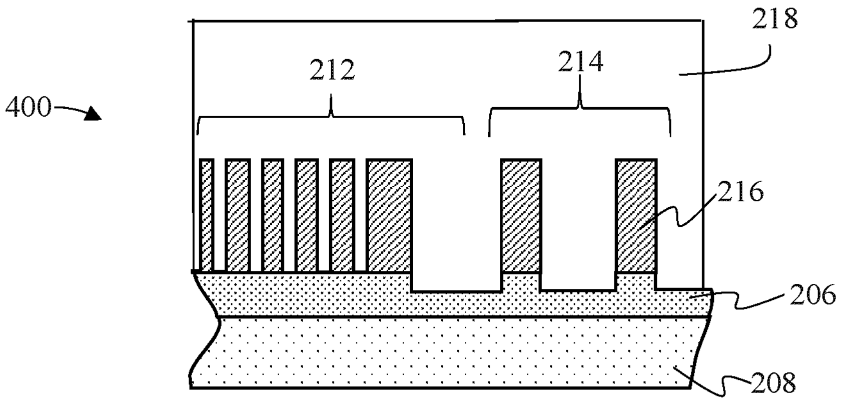
FIG. 4A-FIG. 4B depict an example metastructure optical element.
Figure 4B:
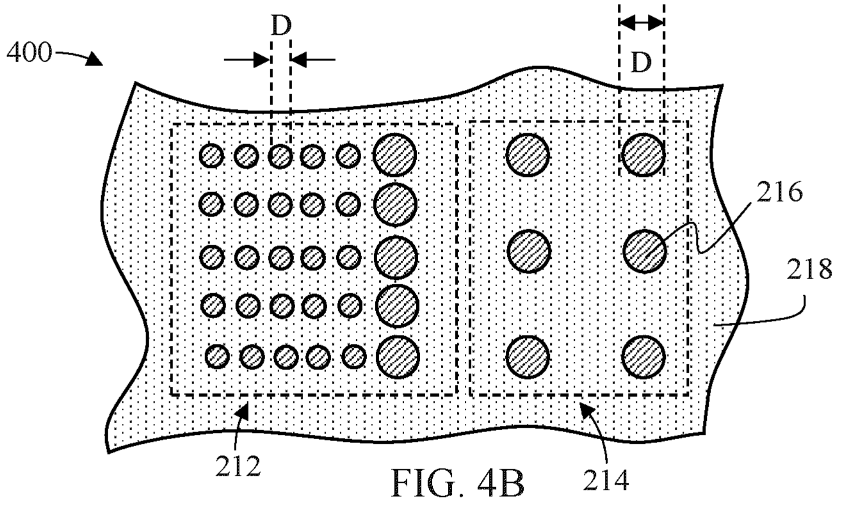

FIG. 4A and FIG. 4B depict an example metastructure optical element 400, which is similar to the structure of FIG. 2D and includes first and second groupings (212 and 214) of meta-atoms 216 having different etch characteristics. Different etch characteristics between the groupings may be determined by the different densities of individual meta-atoms 216 in this example. That is, in some cases, the sum of the areas (e.g., determined via the meta-atom diameters D) of the individual meta-atoms 216 within a first grouping 212 divided by the area of the metastructure optical element over which that particular grouping occupies (the rectangular dashed lines depicted in FIG. 4B) may be different than the same for another grouping 214 of meta-atoms 216. The meta-atoms 216 are encapsulated in a material 218 that is index-matched to the underlying etch-deceleration layer 206 as described above.

Figure 5:
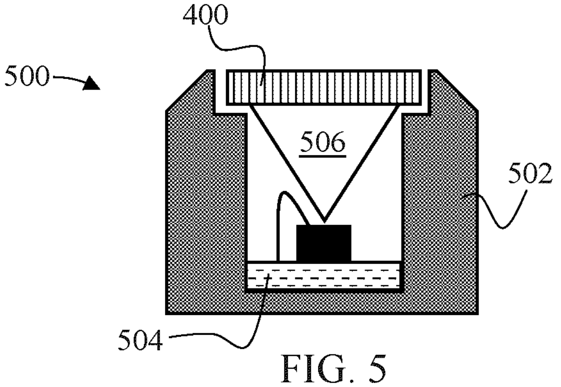
FIG. 5 depicts an example optoelectronic module in which a metastructure optical element is integrated.

FIG. 5 depicts an example optoelectronic module 500 in which a metastructure optical element 400 manufactured according to the disclosed process is integrated. The optoelectronic module 500 includes a housing 502. The housing 502 can be composed of polymeric material, and may be manufactured by injection molding, for example. In some instances, the housing 502 can be composed of a lead frame and be composed of a ceramic and metal material. The optoelectronic module 500 further includes an active optoelectronic element 504 configured to emit or receive light 506. The metastructure optical element 400 is functionally disposed relative to the active optoelectronic element 504. That is, the metastructure optical element 400 is disposed such that the metastructure optical element 400 and the active optoelectronic element 504 can generate the intended optical effect during normal operation of the optoelectronic module 500. Optoelectronic modules such as the example depicted in FIG. 5 and described above can exhibit advanced or more sophisticated optical functionality as a result of the metastructure optical element having two or more groupings of meta-atoms with different etch characteristics incorporated therein, and as a result of the meta-atoms being encapsulated in the index-matched material as described above.

Various modifications may be made within the spirit of this disclosure. Accordingly, other implementations also are within the scope of the claims.

What is claimed is:

1. An apparatus comprising a metastructure optical element, the metastructure optical element comprising:
a substrate;
a first grouping of meta-atoms having a first etch characteristic, the first grouping of meta-atoms being composed of a first etched stratum; and
a second grouping of meta-atoms having a second etch characteristic, the second grouping of meta-atoms being composed of a second etched stratum and an etched optical etch-deceleration layer;
the second etched stratum being disposed on the etched optical etch-deceleration layer, and the optical etch-deceleration layer being disposed on the substrate,
wherein the first and second groupings of meta-atoms are encapsulated in a material that is index-matched to the optical etch-deceleration layer.

2. The apparatus of claim 1 wherein the metastructure optical element further comprises an adhesion layer disposed between the second stratum and the optical etch-deceleration layer.

3. The apparatus of claim 1, wherein the metastructure optical element further comprises an adhesion layer disposed between the optical etch-deceleration layer and the substrate.

4. The apparatus of claim 1, wherein the first grouping of meta-atoms is of a higher density than the second grouping of meta-atoms.

5. The apparatus of claim 1, wherein the first and second groupings of meta-atoms are encapsulated in spin-on glass.

6. The apparatus of claim 1, wherein the first and second groupings of meta-atoms are encapsulated in a polymer.

7. The apparatus of claim 5, wherein the optical etch-deceleration layer is composed of $Al_2O_3$.

8. The apparatus of claim 7 wherein the meta-atoms are composed of at least one of polysilicon, amorphous silicon, crystalline silicon, silicon nitride, zinc oxide, titanium oxide, aluminum zinc oxide, or a niobium oxide.

9. The apparatus of claim 1, further including:
a housing; and
an active optoelectronic element disposed in the housing, the active optoelectronic element operable to emit or receive light;
wherein the metastructure optical element is integrated into the housing and functionally disposed relative to the active optoelectronic element.

10. A method of manufacturing a metastructure optical element, the method comprising:
providing a substrate having an optical etch-deceleration layer thereon, and a stratum over the optical etch-deceleration layer;
forming a mask on the stratum;
etching the stratum and the optical etch-deceleration layer to form a plurality of groupings of meta-atoms, wherein an amount of etching into the optical etch-deceleration layer differs for each of the groupings of meta-atoms, such that a first one of the groupings of meta-atoms is composed of first portions of the stratum, and a second one of the groupings of meta-atoms is composed of second portions of the etched stratum and underlying portions of the optical etch-deceleration layer;
removing the mask; and
encapsulating the first and second groupings of meta-atoms in a material that is index-matched to the optical etch-deceleration layer.

11. The method of claim 10 including encapsulating the first and second groupings of meta-atoms in a spin-on glass.

12. The method of claim 10 including encapsulating the first and second groupings of meta-atoms in a polymer.

13. The method of claim 11, wherein the optical etch-deceleration layer is composed of $Al_2O_3$.

14. The method of claim 13 wherein the meta-atoms are composed of at least one of polysilicon, amorphous silicon, crystalline silicon, silicon nitride, zinc oxide, titanium oxide, aluminum zinc oxide, or a niobium oxide.

* * * * *